United States Patent [19]

Northrup

[11] Patent Number: 5,059,784

[45] Date of Patent: Oct. 22, 1991

[54] OPTICAL MASK FILTER CAPABLE OF REDUCING THE SEMIPERIODIC COMPONENT OF TEMPORAL VARIATION IN ENDPOINT DETECTION

[75] Inventor: Ronnie Northrup, San Jose, Calif.

[73] Assignee: Applied Materials, Inc., Santa Clara, Calif.

[21] Appl. No.: 502,400

[22] Filed: Mar. 30, 1990

[51] Int. Cl.$^5$ ............................................. H01J 40/14
[52] U.S. Cl. ............................ 250/237 R; 250/227.29
[58] Field of Search .......... 250/227.11, 237 R, 227.29; 356/405

[56] References Cited

U.S. PATENT DOCUMENTS

| | | | |
|---|---|---|---|
| 4,245,154 | 1/1981 | Uehara et al. | 250/227.11 |
| 4,247,202 | 1/1981 | Failes | 356/405 |
| 4,314,760 | 2/1982 | Hodge et al. | 250/237 R |

OTHER PUBLICATIONS

Paper by Manush Birang and Ian Latchford Presented at the SPIE Applications of Optical Engineering Conference held on Oct. 12 & 13, 1989.

Primary Examiner—David C. Nelms
Assistant Examiner—Que T. Le
Attorney, Agent, or Firm—John A. Frazzini

[57] ABSTRACT

A mask for reducing a semiperiodic variation of an output signal produced in response to a semiperiodic temporal variation of a distribution of radiation incident on the input of a detector. The mask can have a transmitance that changes abruptly at an outer profile of an opaque region or can have a varation in transmittance that varies continuously.

20 Claims, 6 Drawing Sheets

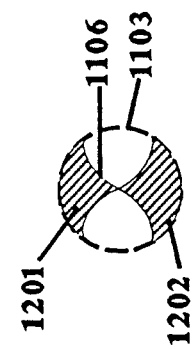
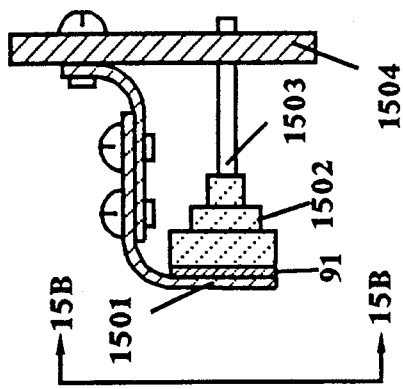
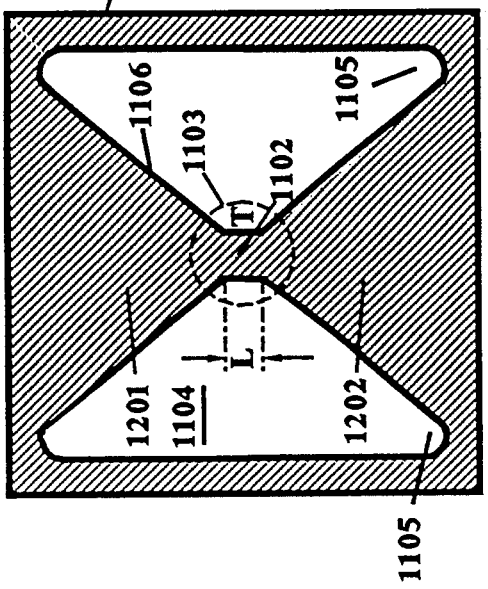
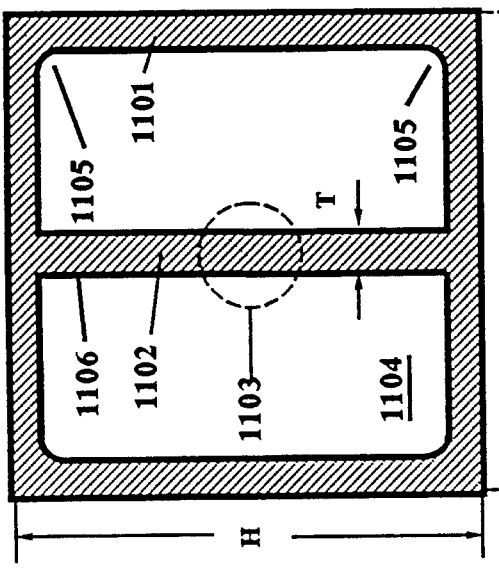
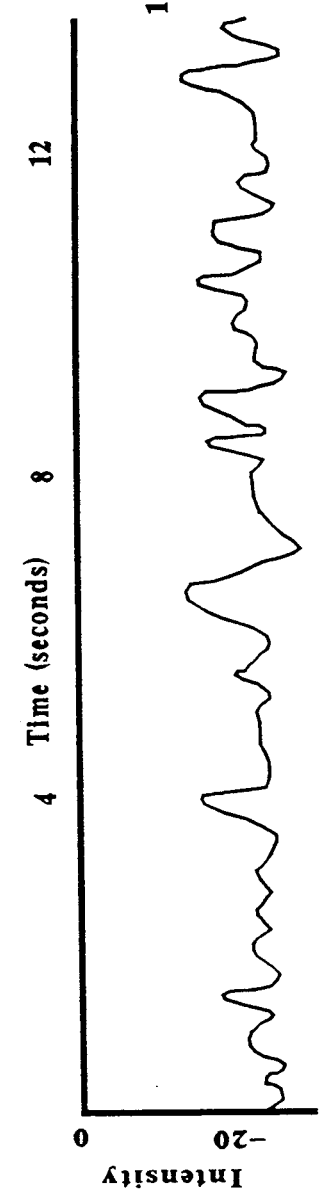

OPTICAL MASK FILTER CAPABLE OF REDUCING THE SEMIPERIODIC COMPONENT OF TEMPORAL VARIATION IN ENDPOINT DETECTION

In the figures, the first digit of a reference numeral indicates the first figure in which is presented the element indicated by that reference numeral.

BACKGROUND OF THE INVENTION

This invention relates in general to signal filtering to separate a signal of interest from a noisy background and relates more particularly to endpoint detection in a wafer fabrication process that has a periodic or approximately periodic (i.e., semiperiodic) temporal variation of a spatial distribution of input light utilized to detect endpoint. In the following discussion, "radiation" means any incident flux of particles or waves and in particular includes the UV/Visible range of wavelengths typically used in optical emissions spectroscopy. "Semiperiodic" means an approximately periodic signal that is the result of a substantially periodic process that produces a substantially periodic signal and an associated, resultant signal that may be aperiodic.

It is becoming increasingly important to be able to accurately detect the endpoint of various steps in a wafer fabrication process. Submicron linewidths and ultrathin layer thickness are becoming common, especially in state of the art devices. In such devices, overprocessing can undercut features, thereby severely affecting yield.

Also, these state of the art devices require processing in single wafer systems. To maintain the same throughput as conventional batch wafer process systems, these single wafer systems must complete each process step much faster than was required in the batch process systems. It is therefore important for system throughput to be able to stop a process step as soon as it is completed. Although it was acceptable to run a batch wafer process system for a preselected interval, in single wafer systems it is important to be able to accurately detect the endpoint of a process step so that processing can be quickly terminated.

In virtually all dry etch processes, such as plasma etch, reactive ion etch (RIE), ion milling, reactive ion beam etch (RIBE), and magnetron etching, light is emitted from the gas phase reactants, from the gas phase products and/or from the film being etched. Etch endpoint occurs when the exposed portion of a film being etched has been completely etched from the substrate surface.

At etch endpoint, some product species cease to be produced and some reactant species cease to be consumed. Therefore, in the gas phase, the reactant species quickly increase in concentration and the product species quickly decrease in concentration. These changes produce concomitant changes in the associated emission and/or absorption spectra intensities of the gas phase and film. Various endpoint detectors are designed to detect this change in optical intensity. Similar changes occur in the optical output spectra of other types of wafer processing systems.

In the endpoint detection system of FIG. 1, light is passed through a fiber optic cable 10 from a wafer processing system, such as the Applied Materials PE5000 plasma chamber 11, to a spectral detector such as monochromator system 12. This system includes a monochromator 13 that is adjusted to direct onto a photomultiplier tube 14 light of a wavelength that changes in intensity at the end of a process step. A high voltage power supply 15 applies to the photomultiplier tube a voltage that can be adjusted to vary the gain of the photomultiplier tube.

A motor 16 is connected by a drive shaft 17 to a radiation dispersive element in the monochromator. This enables the dispersive element to be rotated to change the wavelength component that is directed onto the photomultiplier tube. A scanner interface board 18 connects elements 14, 15 and 16 to an endpoint system 19 that selects the applied voltage and detected wavelength and that receives an input signal S from photomultiplier tube 14. Endpoint system 19 also processes the input signal S from the monochromator to extract in real time a portion of this signal that is indicative of the endpoint of a process step. In an etch process, this endpoint system detects when the etch process reaches and clears a layer interface in the wafer, thereby defining the end-of-etch condition.

A spectrophotometer can be utilized in place of monochromator 13 and photomultiplier tube 14 to provide to endpoint system 19 a spectral output. In such a system, endpoint system 19 would extract from this spectral output the amplitude of the spectral distribution of the chemical species that is being monitored for endpoint detection. Such a system has the advantage of utilizing more than one frequency component of light, thereby improving the signal to noise ratio of the light from the chemical component being monitored.

FIGS. 2 and 3 illustrate the approximately periodic (i.e., semiperiodic) temporal variation of the input signal S to endpoint system 19. Although the rotation of a magnetic field in reactor chamber 11 is periodic, the variation in light intensity to the detector is not purely periodic, but instead is only semiperiodic. By "semiperiodic" is meant the periodic component as well as the associated nonlinear fluctuations that are produced by this periodic variation of a system parameter. FIG. 2 illustrates this signal on a time scale illustrating about 5 semiperiodic cycles. FIG. 3 illustrates this signal on a time scale containing about 40 cycles. FIG. 4 illustrates the temporal variation of the concentration of the chemical component being monitored for endpoint detection. These figures illustrate that the variation of the input signal S is about 15 times larger than the signal of interest in endpoint detection.

In this system, the input signal S to endpoint system 19 is semiperiodic with a period of about 2 seconds. Most of this semiperiodic variation can be removed by averaging over a sufficient number of cycles or by passing this signal through a low pass filter to remove this sinusoidal variation. Typically, a running average of the most recent 20 cycles is produced to decrease the sinusoidal component by a factor of about 20. Since the initial ratio of semiperiodic variation of FIG. 3 compared to the variation of interest of FIG. 4 is about 15, this duration of averaging reduces the semiperiodic component to an acceptable level.

The criterion for endpoint detection is that the ratio of the slope of the averaged signal to a reference slope exceeds 1. If the chemical monitored for endpoint detection increases in concentration at the endpoint, then this reference slope is positive and if the chemical monitored for endpoint detection decreases in concentration at the endpoint, then this reference slope is negative.

Because the semiperiodic component of the averaged signal is still significant, a box method is utilized to eliminate false detections of endpoint. In accordance with this method, the amplitude of the averaged signal is measured periodically at fixed intervals I (e.g., every second) and the incremental change in this amplitude is divided by the temporal interval between these successive measurements times the reference slope. If this ratio $\alpha$ exceeds 1, then the measurement and calculation are repeated at a time equal to I/$\alpha$. If the new value $\alpha'$ again exceeds 1, then the measurement is repeated a third time after an additional time I/$\alpha'$. If this third measurement produces a value $\alpha''$ greater than 1, then an indication is generated that the endpoint has been reached. Thus, an endpoint indication is generated only if the ratio of the slope of the averaged signal to the reference slope exceeds unity in three successive box measurements.

Although this averaging procedure can extract the endpoint signal, there are a number of problems with this approach. The averaging process adds some complexity to the endpoint detection process. More significantly, the averaging process tends to wash out the endpoint signal and produces a delay between the time when the endpoint occurs and the time when the endpoint is detected. These problems are illustrated in FIG. 5.

FIG. 5 illustrates these problems for a situation in which the averaged signal is averaged over an averaging time $T_a$ and in which the transition that occurs in this input signal 52 at the endpoint takes place over an interval of duration $T_t$. The resulting transition in averaged signal 51 occurs over an interval of duration $T_a + T_t$. Thus, the slope of this transition is decreased by a factor $T_t/(T_t+T_a)$. Typical process times are from 30-120 seconds and typical transition times are about 5%-8% of the process time. Thus, typical values of $T_t$ are 1.5-9.6 seconds. For example, if the transition in input signal 52 takes a time $T_t=4$ seconds and the averaging time $T_a$ is 40 seconds, then the slope is reduced by a factor of 1/11.

When the slope of a transition in the averaged signal is small, low levels of noise and the remaining semiperiodic component of the averaged signal will significantly affect the slope of the curve within the transition interval. This increased sensitivity of low slope transitions strongly counters the benefits of the averaging process.

The averaging process also delays the detection of the endpoint. If the midpoint of the transition in signal 52 is taken as the endpoint, then the detected endpoint occurs in the middle of the transition in signal 51. The detected endpoint thus occurs an interval $T_a/2$ later than the actual endpoint. Thus, the averaging process introduces a sizable delay between the occurrence of the endpoint and the detection of this occurrence. Especially in wafer process steps that are completed in a time comparable to or smaller than the averaging time $T_t$, this delay will have a significant effect on throughput and on overprocessing of the wafer. For example, for an etch process taking 30 seconds and an averaging time of 40 seconds, there will be 67% overprocessing. This amount of overprocessing is particularly critical in plasma etch processes because the plasma often etches other layers at significant rates. Therefore, it is important to eliminate or at least significantly reduce the amount of averaging that is required to pull the endpoint signal out of the input signal S to endpoint system 18.

SUMMARY OF THE INVENTION

In accordance with the illustrated preferred embodiment, a spatial filter is utilized to significantly reduce the semiperiodic component of an input signal S produced by a photodetector in response to an optical source that produces on the photodetector a spatial distribution of incident light that varies periodically. In particular, this type of variation in light intensity occurs in the PE5000 Plasma Etch System manufactured by Applied Materials, Inc.. Similar variations can occur in systems that detect other types of radiation for different purposes. The disclosed filter is applicable to all of these cases.

As is illustrated in FIG. 6, in this system, a first pair of magnetic coils 61 produces within reactor chamber 11 a magnetic field that is approximately parallel to the x-axis and a second pair of magnetic coils 62 produces within reactor chamber 11 a magnetic field that is approximately parallel to the y-axis. The field from coils 61 varies in amplitude as cos($\omega$t) and the field from coils 62 varies in amplitude as sin($\omega$t) so that the net magnetic field has approximately constant amplitude and points in a direction that rotates counter clockwise about the z-axis at an angular frequency $\omega$.

An electric field is also produced in the z-direction to accelerate ions into a wafer 65 to etch the top surface of the wafer. The magnetic field is rotated about the z-axis at a rate on the order of $\frac{1}{2}$ cycle per second to produce a cylindrically symmetric average etch, thereby improving etch uniformity.

Because the magnetic field is stronger near the sidewall 63 of the chamber and because the formation of a plasma is a nonlinear process, the plasma forms in a single region near sidewall 63. As the magnetic field rotates about reactor chamber 11 at an angular frequency $\omega$, the plasma rotates around the chamber at substantially a constant angular rate. In FIGS. 7 and 9, line 71 is drawn between the center 72 of the plasma region and the center 73 of reactor chamber 11. The angle $\phi$ between line 71 and the x-axis increases substantially as $\omega$t and is substantially parallel to the magnetic field. As the magnetic field rotates around the z-axis, this plasma region rotates around the z-axis as is illustrated in FIG. 7 by the four sequential locations A-D of the plasma.

Although the rotation of the magnetic field is periodic, the variation in light intensity to the detector is not purely periodic, but instead is only "semiperiodic". By semiperiodic is meant the periodic component as well as the associated nonlinear fluctuations that are produced by this periodic variation of a system parameter. In this particular case, the nonlinear plasma process and the nonlinear interaction between the plasma and the wafer and other adjacent regions introduce some aperiodic response of the plasma to the substantially periodic variation of the magnetic field. Interaction between the magnetic field and the plasma can produce some aperiodic variation in the magnetic field. However, all of these aperiodic components result from the periodic variation of the currents applied to magnetic coils 61 and 62 and are therefore considered to be part of the semiperiodic variations within reactor chamber 11.

To detect the endpoint of the plasma etch process within chamber 11, a fiber optic cable 10 (illustrated in FIGS. 7 and 9) is aligned along an x-axis that passes through the center of circular chamber 11 to transmit to monochromator system 12 some of the light that passes through an optical opening in sidewall 63 (for example, such as window 64). Only light incident on the input end of fiber optic cable 10 at an angle $\theta$ within an acceptance angle $\Delta/2$ is transmitted along the cable to monochromator system 12.

Even for light within this acceptance angle $\Delta/2$, the greater the angle $\theta$ between the x-axis and the direction of this incident light, the smaller the fraction of light actually transmitted to monochromator 12. Because of this, the intensity of light reaching monochromator 12 varies as indicated in FIG. 8, where $\phi$ (shown in FIG. 7) is the angle of rotation of the displacement about the z-axis of the center of the plasma region. This intensity has maxima for angles of $\phi$ equal to 0 and $\pi$ (i.e., for the plasma region at either of points A and C) and has minima for angles of $\phi$ equal to $\pm(\Delta+\pi)/2$ (i.e., for the plasma region at either of points B and D). This is the cause of the large semiperiodic variations in detected intensity illustrated in FIGS. 2 and 3.

Because different portions of the plasma region sweep through the center of the acceptance angle $\Delta/2$ as $\phi$ varies with time, the spectral distribution of the light collected by fiber optic cable 10 will exhibit some semiperiodic variation with time. The primary effect caused by the variation of $\phi$ with time is the semiperiodic variation of the flux $F(\theta,t)$ of light incident on the input of fiber optic cable 10 from the direction $\theta$. Such amplitude modulation produces changes in the slope of the input signal S to endpoint system 19 that can incorrectly be detected as the change of slope indicative of the process endpoint. Therefore, the averaging process needs to suppress this semiperiodic component without averaging away the transition that is indicative of the endpoint.

Any frequency filtering of the input signal S to endpoint system 19 should strongly suppress frequency components near the (typically ½ Hz) frequency of rotation of the magnetic field and should pass the lower frequency components that are characteristic of the transition that is indicative of the endpoint. When averaging is utilized to discriminate against the semiperiodic component of the input signal, this averaging is mathematically equivalent to an integration over time.

The rotation frequency of the plasma can be selected to tradeoff improvement of endpoint detection against the other factors that go into the selection of this frequency. An increase in the rotation frequency tends to push the plasma toward the wall 63 of chamber 11 so that an increase in this frequency to improve endpoint detection will tend to degrade wafer processing uniformity. However, because of the nonlinear behavior of the plasma, the aperiodic variations in the input signal S to endpoint detector 19 are not generally negligible. An integration over an integral number of periods of the periodic component substantially eliminates this component. The number of periods over which the averaging occurs is selected to adequately suppress the aperiodic component of the input signal.

In accordance with the illustrated preferred embodiment, a spatial mask 91 is placed between the input end of the optical fiber and the plasma chamber to suppress the semiperiodic component of the input signal S. Light incident on the mask at an angle $\theta$ from a normal to the mask experiences a transmittance $T(\theta)$ that is selected to optimize suppression of the semiperiodic component of the incident flux $F(\theta,t)$. In one embodiment, the mask reduces the intensity of light accepted by the fiber when the plasma is at or near regions A or C. This mask excludes from fiber optic cable 10 light incident within an angle $\lambda/2$, referred to herein as the exclusion angle. As is illustrated in FIG. 10, this converts the intensity maximum at point C into an intensity minimum.

The magnitude of exclusion angle $\lambda/2$ is selected to minimize the peak to peak variation of the intensity as a function of $\phi$. Approximately equal minima occur for the plasma centered at any of points B, C and D and approximately equal maxima occur for the plasma centered between these points. The intensity at points B and D is adjusted by movement of the input end of fiber optic cable 10 closer to or farther from the z axis and/or by selecting a fiber optic cable with a different acceptance angle. This can also be achieved by means of optical elements between the input end of the fiber optic cable and the reactor chamber.

It should be noted that the curve in FIG. 10 is approximately periodic with a period that is one third that of the curve in FIG. 8. Thus, mask 91 triples the frequency of the primary frequency component of the input signal S to endpoint system 19, thereby enabling more effective filtering of this component.

Not only does the reduced variation of the input signal S reduce the time needed to extract the end of process signal of FIG. 4, it also decreases an initial interval of photomultiplier gain optimization achieved by use of an automatic gain control circuit. When the mask reduces the peak to peak variation of the intensity of light on fiber optic cable 10, the optimized gain can be achieved much more quickly. This is important for process steps that are completed in a short time (e.g., on the order of 30 seconds).

A mask having a transmittance $T(\theta)$ can be useful in applications other than the wafer processing apparatus of FIG. 1. For example, a flux $F(\theta,t)$ having a semiperiodic component can result in a system having a moving detector and a stationary source. In general, this mask can be used to reduce the semiperiodic component regardless of the cause of the flux $F(\theta,t)$.

These and other objectives and advantages of the present invention will become clear from the detailed description given below in which a preferred embodiment is described in relation to the drawings. The detailed description is presented to illustrate the present invention, but is not intended to limit it.

DESCRIPTION OF THE FIGURES

FIG. 11 illustrates the mask utilized in the apparatus of FIG. 10 to reduce the peak to peak variation of the input signal S to endpoint system 19.

FIG. 12 illustrates an alternate embodiment of the mask of FIG. 11.

FIG. 13 illustrates the significantly reduced amplitude of semiperiodic variation of the input signal S to endpoint system 19 resulting from the inclusion of a spatial mask in the system of FIG. 9.

FIG. 14 illustrates a mask having a curved profile that is selected to minimize the semiperiodic component of input signal S.

FIGS. 15A and 15B illustrate a fiber optic clamp and flange used to hold the mask and fiber optic cable in front of the optical opening in the wall of the reactor.

DESCRIPTION OF THE PREFERRED EMBODIMENT

Figure 9:
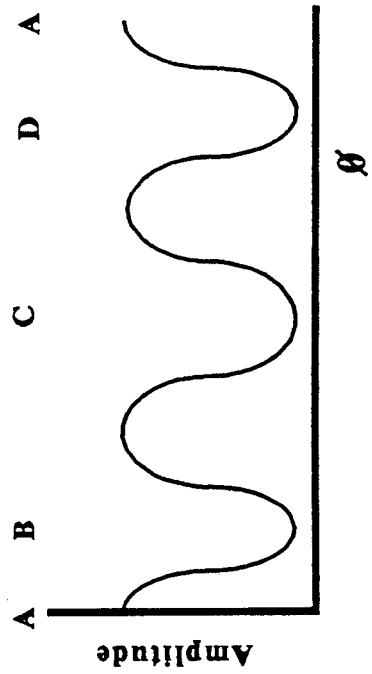
FIG. 9 illustrates the inclusion of a spatial mask in the endpoint detector system of FIG. 7 to substantially reduce the magnitude of semiperiodic variation of the input signal S to endpoint system 19.
Figure 8:
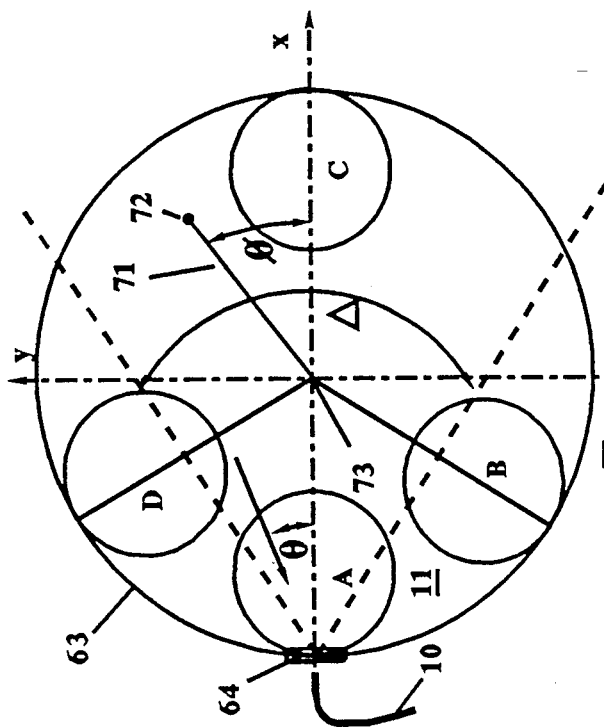
FIG. 8 illustrates the variation of the input signal S to endpoint system 19 caused by the rotation of the plasma around the chamber.
Figure 10:
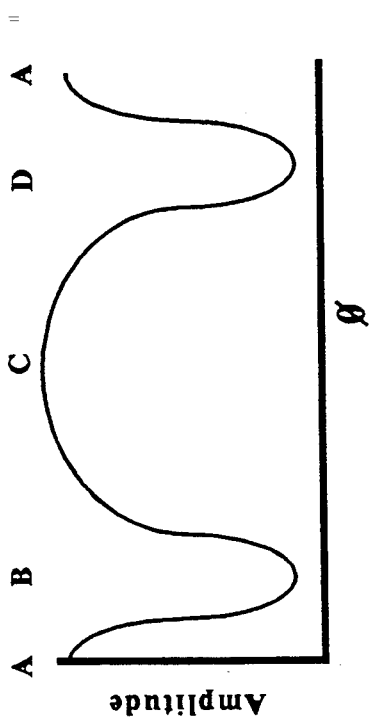
FIG. 10 illustrates the effect of the spatial mask on the input signal S to endpoint system 19.

FIG. 11 illustrates a particular configuration of mask 91 of FIG. 9. This mask consists of a rectangular frame 1101 of height H and base B lengths approximately equal to one inch. H and W are selected so that this frame will be positioned outside of the acceptance angle $\Delta/2$ of fiber optic cable 10. The thickness of this frame is therefore determined only by the need for sufficient strength to be durable.

Centered laterally within this frame is a vertical opaque bar 1102 of width T that is centered in front of the input end of fiber optic cable 10 in FIG. 9. This bar blocks light directed toward the fiber within a cylindrical region having a triangular base that form and angle $\lambda$ at the input end of fiber optic cable 10. The angle $\lambda/2$ is referred to as the exclusion angle. The portion of the mask that intersects the cone defined by the acceptance angle $\Delta/2$ is indicated by dashed line 1103. Thus, only the center section of the bar of length about 0.3 inches affects the intensity of light on the input end of the fiber optic cable.

The width T is selected to produce an exclusion angle $\lambda/2$ that substantially minimizes the peak to peak variation, as a function of $\lambda$, of the amplitude of the input signal S to endpoint system 19. This is achieved for a width T of approximately 0.1 inch. As can be seen from FIG. 9, this choice results in nearly all of the plasma being masked at position C and of about 20% of the plasma being masked at position A. This converts point C from a maximum to a minimum of intensity substantially equal to the minima at points B and D and reduces the intensity at point A to substantially the same intensity at the maximum between points B and C and the maximum between points C and D.

Figure 1:
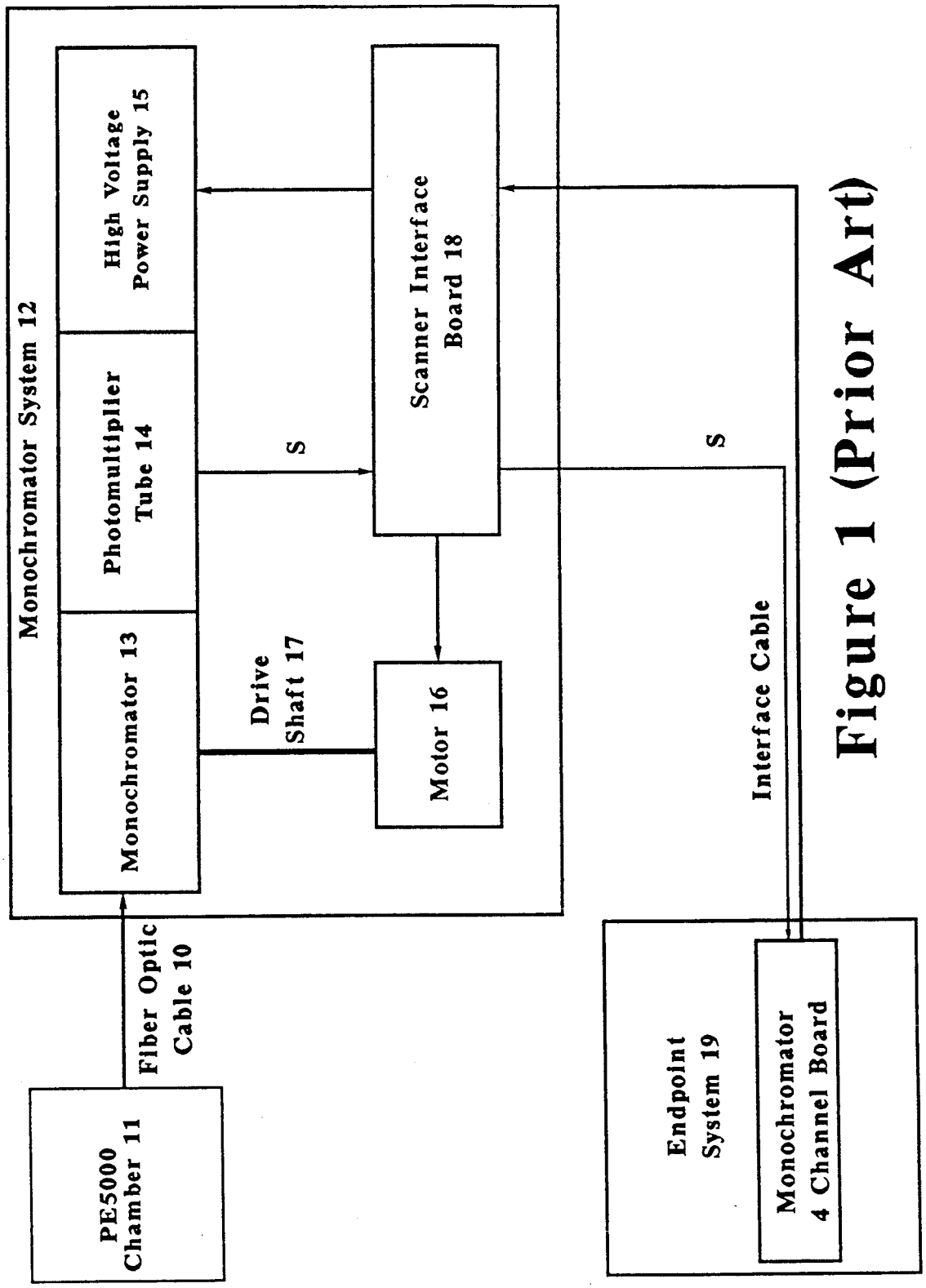
FIG. 1 illustrates a typical endpoint detection system.
Figure 2:
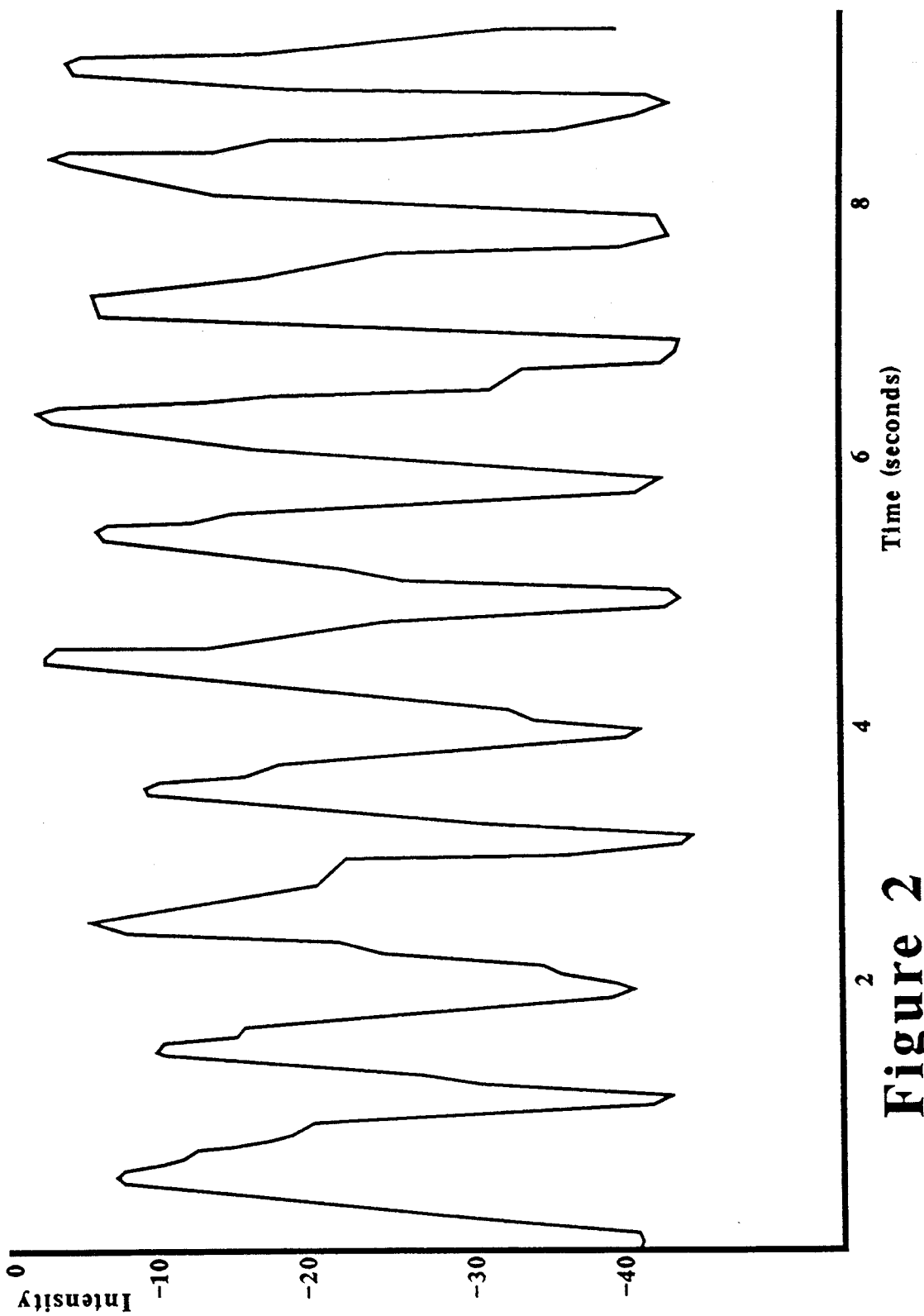
FIG. 2 illustrates the semiperiodic variation of the input signal to endpoint system 19 for an interval containing about 10 periods of this signal.
Figure 3:
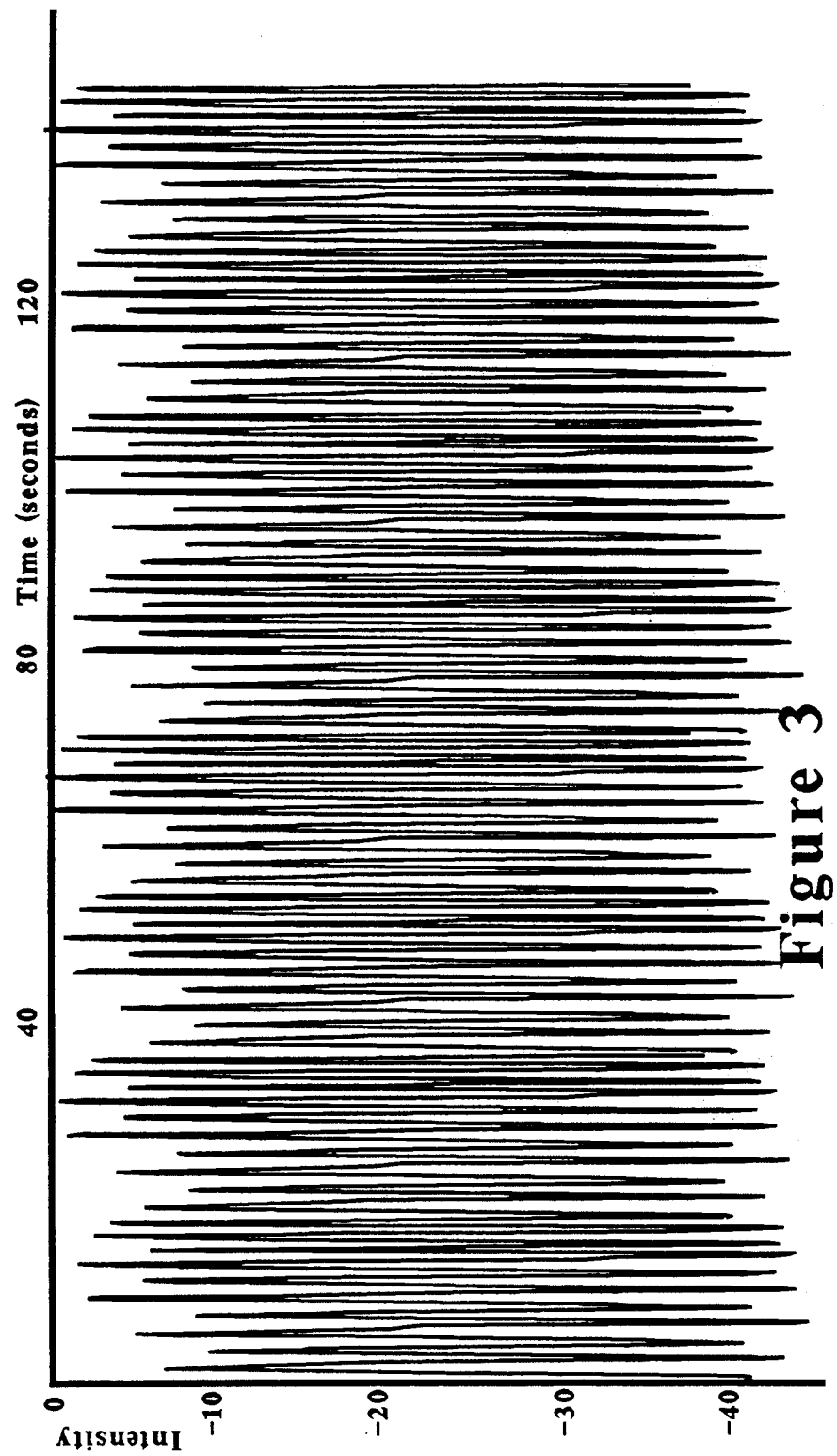
FIG. 3 illustrates the semiperiodic variation of the input signal S to endpoint system 19 for an interval containing about 80 periods of this signal.
Figure 4:
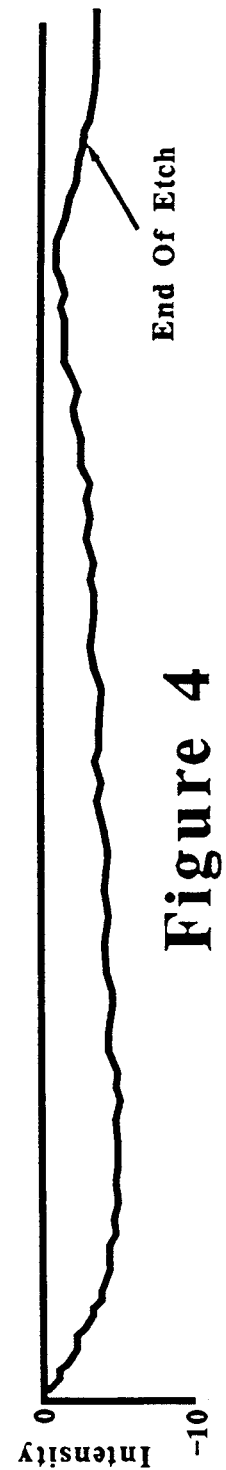
FIG. 4 illustrates a running average of the signal of FIG. 3, enabling the end of etch to be detected.
Figure 5A:
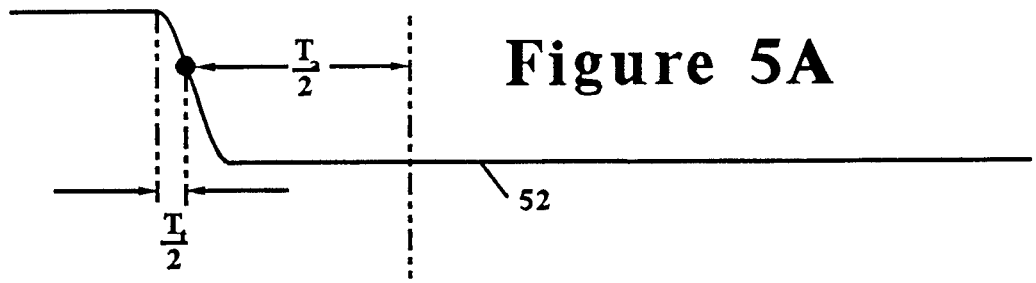
FIGS. 5A and 5B illustrate the flattening of the end of etch transition edge and the delay in detecting end of etch caused by averaging the input signal S to endpoint system 19.
Figure 5B:
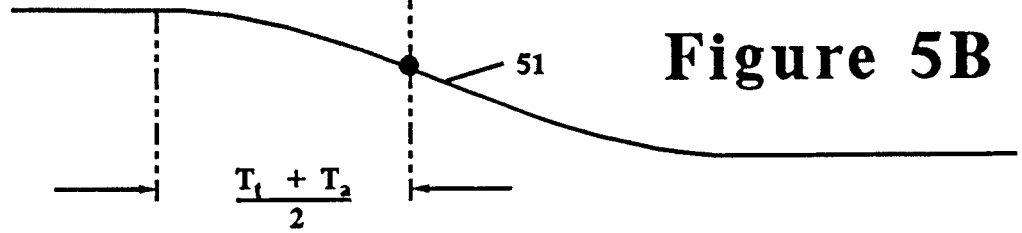

FIG. 2 illustrates an alternative embodiment of the mask that additionally includes a pair of triangular opaque regions 1201 and 1202 the block light directed toward the fiber optic cable from the top and bottom regions of the reactor chamber. It is believed that light coming from the vicinity of the wafer or the target has a variable amplitude caused by scattering and interference effects resulting from backscatter from features on the wafer and target. Experimental results confirm that regions 1201 and 1202 reduce peak to peak variation of the input signal S to endpoint system 19. FIG. 13 illustrates the temporal dependence of input signal S when mask 91 is included between fiber optic cable 10 and the light from chamber 11. Comparison of this plot with that in FIG. 2 illustrates the striking decrease in the semiperiodic component of the signal, thereby enabling adequate additional filtering of this signal to be achieved by averaging over a much shorter interval than previously required. The previous averaging interval of about 40 seconds can be reduced to about 6 seconds to achieve the same level of semiperiodic component exhibited in FIG. 4. This enables the endpoint to be more quickly detected, thereby avoiding much of the previous overprocessing and detrimental effect on system throughput.

Within circle 1103, the mask can take other more complicated shapes such as is illustrated in FIG. 14. If the plasma region passed across the front of fiber optic cable 10 only once per revolution of the plasma around the reactor chamber, then the shape of edge 1106 would be selected to convert this modulated amplitude to a constant amplitude.

Unfortunately, as the plasma field rotates once around chamber 11, the plasma sweeps twice across the input end of the fiber optic cable. A profile 1106 that flattens the curve from point B to point D will not necessarily also flatten the curve from point D back to point B. However, a curve generally of the shape in FIG. 14 will provide extra degrees of freedom in flattening the curve and therefore will produce a flatter curve that is achieved by the mask of FIG. 11.

Because of the nonlinear nature of plasmas, the optimized profile 1106 will be dependent on details of the reactor chamber and process. For example, changes in the gases supplied to the reactor, the vacuum pressure, the gas flow rates, the chamber temperature, the magnetic field flux, the magnetic field period and the voltage bias all affect the intensity of light from the reactor chamber. The optimized profile is therefore best determined empirically. In addition to these masks having opaque and transparent regions designed to reduce as much as possible the fraction of masked signal that has a semiperiodic variation, other masks can consist of translucent regions having a spatial variation of translucence selected to minimize this fraction. Also, an effective mask can be produced by connecting to the input of the detector two or more fiber optic cables aimed at different portions of the reactor to produce one or more exclusion angles. Indeed, any input means that enables selective discrimination against light entering the detector at various angles $\theta$ can function as a mask.

Figure 6:
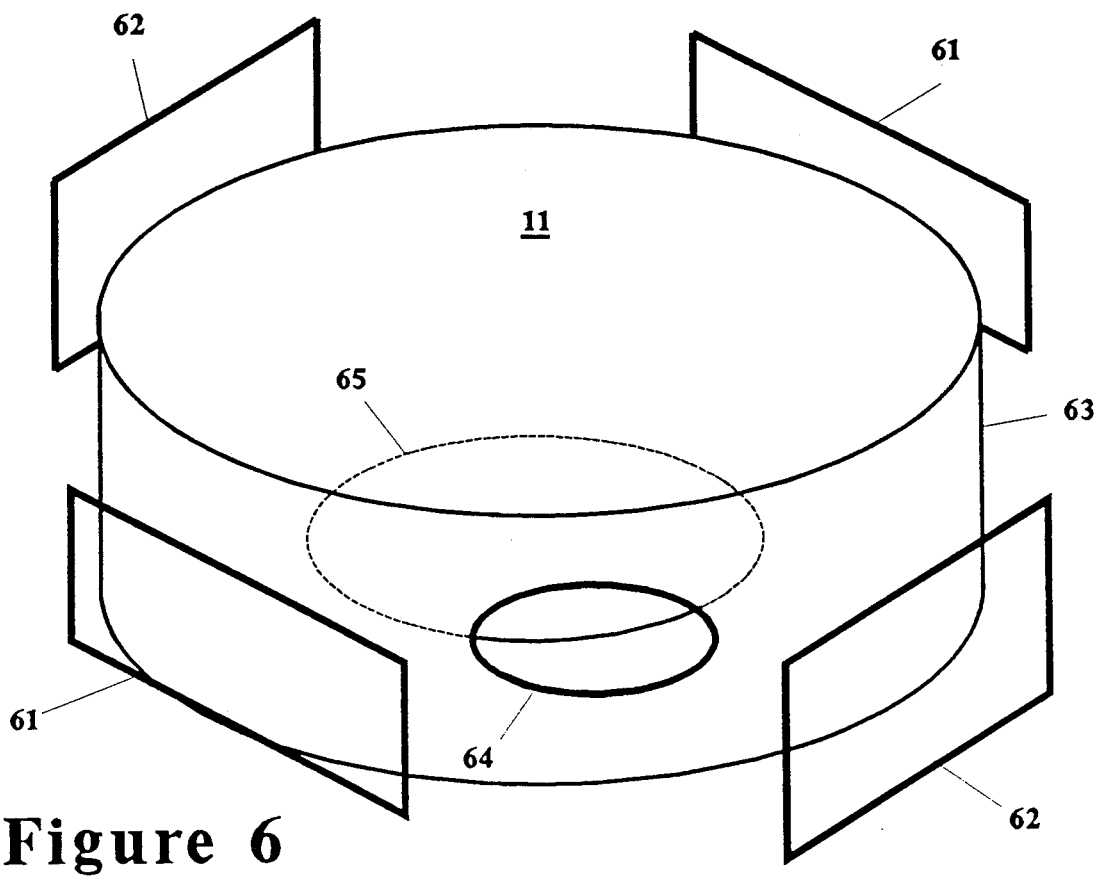
FIG. 6 illustrates the magnetic coils of wafer processing system 11.
Figure 7:
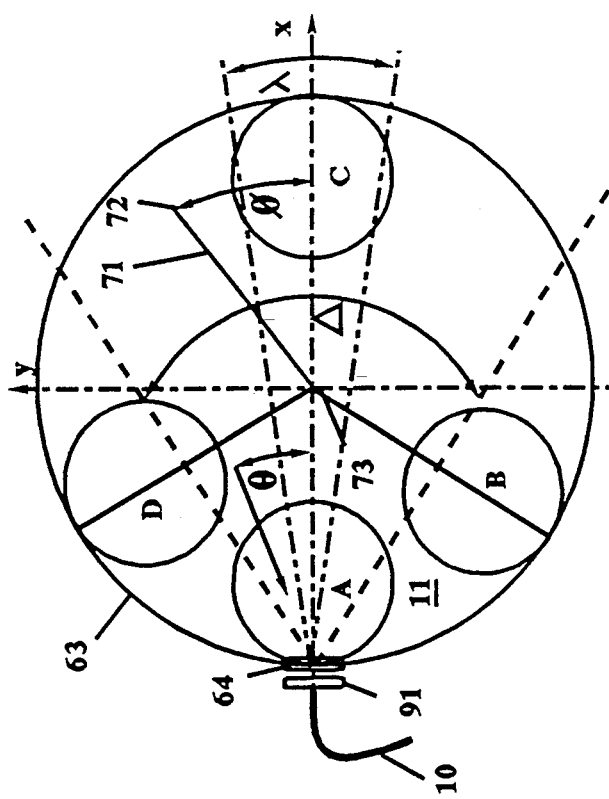
FIG. 7 illustrates the acceptance angle of a fiber optic cable used to collect light from the process chamber and illustrates the rotation of the plasma field about the z-axis of the process chamber.

A mask having the optimized profile can be easily manufactured by milling this shape in a sheet of thin (approximately 0.06 inch thick) aluminum. The mask is then held in place by inserting it between a fiber optic clamp 1501 and a fiber optic flange 1502 used to rigidly attach the input end 1503 of the fiber optic cable 10 in front of optical opening 64. In the wafer processing reactor of FIG. 6, clamp 1501 can be attached to a magnetic shield 1504 located adjacent to window 64.

Screws 1505 used to screw flange 1502 to clamp 1501 are located to fit snugly into corners 1105 of openings 1104 of mask 91, thereby easily aligning the mask accurately in front of the fiber optic cable 10. The distance d of input end 1504 can be adjusted to fine tune the location of the conical region within which light incident on input end 1503 is transmitted by fiber optic cable 10 to monochromator system 12.

I claim:

1. A mask capable of reducing a semiperiodic component of temporal variation of a detector signal in a detector system in which a flux $F(\theta)$ of radiation is incident over a range of directions $\theta$ from a radiation source onto an input of a detector and in which said flux exhibits a semiperiodic temporal component of variation, said mask comprising:

a radiation transmission filter that transmits a fraction $T(\theta)$ of light incident at an angle $\theta$ relative to a reference direction; and aligning fixture means for accurately aligning the transmission filter between the radiation source and the input of said detector.

2. A mask as in claim 1 wherein said radiation transmission filter comprises:

a radiation intercepting section that is to be positioned within a conical region of vertex angle $\Delta/2$ outside of which the detector is not responsive to incident radiation, said radiation intercepting section having a spatial distribution of transmittance selected to minimize, in an output signal from said detector, the fraction of the output signal that is semiperiodic.

3. A mask as in claim 2 wherein said aligning means comprises:

a frame connected to the light intercepting portion for mounting and aligning the mask in front of the input to the detector; and a clamp into which said frame fits with close tolerance to accurately align said frame in said clamp.

4. A mask as in claim 2 wherein, within the region in which the radiation intercepting section intersects said conical region, said radiation intercepting section is opaque within a rectangular profile.

5. A mask as in claim 4 wherein this rectangular opaque area has a width T selected to substantially minimize the fraction of the detector output signal that is semiperiodic.

6. A mask as in claim 2 wherein, within the region in which the radiation intercepting section intersects said conical region, said radiation intercepting section is opaque within a profile that is rectangular in a central region and flares outward from a top end and a bottom end of this rectangular central region.

7. A mask as in claim 6 wherein the rectangular central region has a width T and a length L that are selected to minimize, in the output signal, the fraction of the output signal that is semiperiodic.

8. A mask as in claim 2 wherein, within the region in which the radiation intercepting section intersects said conical region, said radiation intercepting section has a profile that is defined by a curve selected to minimize, in the output signal, the fraction of the output signal that is semiperiodic.

9. A mask as in claim 2 wherein the transmittance of said radiation intercepting section has a transmittance that varies continuously within the two dimensional region that intersects said conical region and said continuous variation substantially minimizes, in an output signal from said detector, the fraction of the output signal that is semiperiodic.

10. A mask as in claim 1 wherein said radiation transmission filter comprises:

a plurality of fiber optic cables each having an associated acceptance angle and each being aligned in a preselected direction to produce said transmittance $T(\theta)$.

11. A radiation detection system having a mask capable of reducing a semiperiodic component of temporal variation of a detector signal in a detector system in which a flux $F(\theta)$ of radiation is incident over a range of directions $\theta$ from a radiation source onto an input of a detector and in which said flux exhibits a semiperiodic temporal component of variation comprising:

a detector having an input on which a flux of radiation can be incident over said range of directions, and wherein said mask is disposed between said radiation flux source and said detector, said mask comprising:

a radiation transmission filter that transmits a fraction $T(\theta)$ of light incident at an angle $\theta$ relative to a reference direction; and aligning fixture means for accurately maintaining the alignment of the transmission filter between the radiation source and the input of said detector.

12. A radiation detection system as in claim 10 wherein said radiation transmission filter comprises:

a radiation intercepting section that is to be positioned within a conical region of vertex angle $\Delta/2$ outside of which the detector is not responsive to incident radiation, said radiation intercepting section having a spatial distribution of transmittance selected to minimize, in an output signal from said detector, the fraction of the output signal that is semiperiodic; and means for accurately aligning the radiation intercepting section in front of the input of said detector.

13. A radiation detection system as in claim 11 wherein said aligning means comprises:

a frame connected to the light intercepting portion for mounting and aligning the radiation intercepting section in front of the input to the detector; and a clamp into which said frame fits with close tolerance to accurately align said frame in said clamp.

14. A radiation detection system as in claim 11 wherein, within the region in which the radiation intercepting section intersects said conical region, said radiation intercepting section is opaque within a rectangular profile.

15. A radiation detection system as in claim 13 wherein this rectangular opaque area has a width T selected to substantially minimize the fraction of the detector output signal that is semiperiodic.

16. A radiation detection system as in claim 11 wherein, within the region in which the radiation intercepting section intersects said conical region, said radiation intercepting section is opaque within a profile that is rectangular in a central region and flares outward from a top end and a bottom end of this rectangular central region.

17. A radiation detection system as in claim 15 wherein the rectangular central region has a width T and a length L that are selected to minimize, in the output signal, the fraction of the output signal that is semiperiodic.

18. A radiation detection system as in claim 11 wherein, within the region in which the radiation intercepting section intersects said conical region, said radiation intercepting section has a profile that is defined by a curve selected to minimize, in the output signal, the fraction of the output signal that is semiperiodic.

19. A radiation detection system as in claim 11 wherein the transmittance of said radiation intercepting section has a transmittance that varies continuously within the two dimensional region that intersects said conical region and said continuous variation substantially minimizes, in an output signal from said detector, the fraction of the output signal that is semiperiodic.

20. A radiation detection system as in claim 11 wherein said radiation transmission filter comprises:
a plurality of fiber optic cables each having an associated acceptance angle and each being aligned in a preselected direction to produce said transmittance $T(\theta)$.

* * * * *